(12) United States Patent
Bieck et al.

(10) Patent No.: US 7,700,957 B2
(45) Date of Patent: Apr. 20, 2010

(54) PROCESS FOR MAKING CONTACT WITH AND HOUSING INTEGRATED CIRCUITS

(75) Inventors: Florian Bieck, Mainz (DE); Jürgen Leib, Freising (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/947,974

(22) Filed: Sep. 22, 2004

(65) Prior Publication Data

US 2005/0042786 A1    Feb. 24, 2005

Related U.S. Application Data

(62) Division of application No. 10/228,699, filed on Aug. 26, 2002.

(30) Foreign Application Priority Data

Aug. 24, 2001  (DE) ............................... 101 41 558
Aug. 24, 2001  (DE) ............................... 101 41 571
Jun. 6, 2002   (DE) ............................... 102 25 373

(51) Int. Cl.
*H01L 27/15* (2006.01)
(52) U.S. Cl. .................. 257/82; 257/81; 257/432; 257/723; 257/777; 257/E31.058
(58) Field of Classification Search ................ 257/723, 257/621, 81, 82, 432, 433, 724, 777
See application file for complete search history.

(56) References Cited

U.S. PATENT DOCUMENTS 5,244,817 A    9/1993   Hawkins (Continued)

FOREIGN PATENT DOCUMENTS

DE    43 14 907    5/1993

(Continued)

OTHER PUBLICATIONS

David Maliniak, "*Vertical Integration of Silicon Allows Packaging of Extremely Dense System Memory in Tiny Volumes: Memory-Chip Stacks Send Destiny Skyward*", Aug. 22, 1994.

(Continued)

*Primary Examiner*—Wai-Sing Louie
(74) *Attorney, Agent, or Firm*—Ohlandt, Greeley, Ruggiero & Perle, L.L.P.

(57) ABSTRACT

The invention proposes a process for producing electrical contact connections for at least one component which is integrated in a substrate material, the substrate material having a first surface region, and at least one terminal contact being arranged at least partially in the first surface region for each component, which is distinguished in particular by application of a covering to the first surface region and production of at least one contact passage which, in the substrate material, runs transversely with respect to the first surface region, in which process, in order to form at least one contact location in a second surface region which is to be provided, at least one electrical contact connection from the contact location to at least one of the terminal contacts is produced via the respective contact passages. Very advantageously, it is in this way possible for a contact location to be produced on the terminal contact and therefore a contact location which is electrically connected to the terminal contact can be produced on that side of the substrate material which is remote from the active surface, it being possible to dispense both with trenches which run along the substrate material and with a lateral contact which leads around the component in accordance with the prior art.

6 Claims, 11 Drawing Sheets

U.S. PATENT DOCUMENTS

| | | | | |
|---|---|---|---|---|
| 5,254,868 | A | | 10/1993 | Saito |
| 5,330,918 | A | | 7/1994 | Dubbelday et al. ............. 438/73 |
| 5,468,681 | A | | 11/1995 | Pasch ......................... 438/108 |
| 5,610,431 | A | * | 3/1997 | Martin ........................ 257/415 |
| 5,766,979 | A | | 6/1998 | Budnaitis |
| 5,807,783 | A | | 9/1998 | Gaui et al. .................. 438/406 |
| 5,814,889 | A | | 9/1998 | Gaul |
| 5,965,933 | A | | 10/1999 | Young et al. |
| 6,114,191 | A | | 9/2000 | Young et al. |
| 6,171,887 | B1 | | 1/2001 | Yamaji |
| 6,338,284 | B1 | | 1/2002 | Najafi et al. |
| 6,384,353 | B1 | | 5/2002 | Huang et al. |
| 6,393,183 | B1 | * | 5/2002 | Worley ......................... 385/39 |
| 6,448,168 | B1 | | 9/2002 | Rao et al. .................... 438/598 |
| 6,461,888 | B1 | | 10/2002 | Sridhar et al. |
| 6,489,675 | B1 | | 12/2002 | Gruber et al. |
| 6,501,182 | B2 | * | 12/2002 | Kobayashi et al. ........... 257/774 |
| 6,503,793 | B1 | * | 1/2003 | Chittipeddi et al. ......... 438/243 |
| 6,515,355 | B1 | * | 2/2003 | Jiang et al. .................. 257/678 |
| 6,541,987 | B1 | * | 4/2003 | Bruce ......................... 324/752 |
| 6,580,858 | B2 | | 6/2003 | Chen et al. |
| 6,703,689 | B2 | * | 3/2004 | Wada ......................... 257/621 |
| 2002/0028537 | A1 | | 3/2002 | Farnworth |
| 2002/0135069 | A1 | | 9/2002 | Wood et al. |
| 2003/0001240 | A1 | | 1/2003 | Whitehair et al. ........... 257/638 |
| 2003/0092243 | A1 | | 5/2003 | Hirschfeld et al. .......... 438/455 |

FOREIGN PATENT DOCUMENTS

| | | |
|---|---|---|
| DE | 198 46 232 | 10/1998 |
| DE | 199 18 671 | 4/1999 |
| DE | 197 46 641 | 10/1999 |
| DE | 199 58 486 | 12/1999 |
| EP | 0810659 | 12/1997 |
| JP | 321859 | 3/1991 |
| JP | 6113214 | 4/1994 |
| JP | 10335337 | 12/1998 |
| JP | 2000195861 | 7/2000 |
| JP | 2001177081 | 6/2001 |
| JP | 2001351997 | 12/2001 |
| WO | WO9417557 | 8/1994 |
| WO | WO 98/52225 | 11/1998 |
| WO | WO 99/40624 | 8/1999 |
| WO | WO01/80285 | 10/2001 |

OTHER PUBLICATIONS

Yoshihiro Morimoto, et al., "*Influence of the Grain Boundries and Intagrain Defects on the Performance of Poly-Si Thin Film Transistors*", Jul. 7, 1997.

Jaafar, et al., "A Plated Through Interconnect Technology in Silicon", Jul. 7, 1997.

Koyanangi, et al., "*Future System-On-Silicon LSI Chips*", 1998.

David Morrison, "*Wafer-Level Processing Cuts Chip-Scale Packaging Cost*", Oct. 18, 1999.

Office Action dated May 8, 2009 corresponding to Japanese Patent Application No. 2003-523003.

Office Action dated Jul. 17, 2008 corresponding to Japanese Patent Application No. 2003-523003.

Office Action dated Sep. 26, 2007 corresponding to Japanese Patent Application No. 2003-523003.

Office Action dated Nov. 7, 20006 corresponding to European Patent Application No. 02796172.1-1235.

Office Action dated Aug. 25, 2006 corresponding to Chinese Patent Application No. 02816578.0.

Office Action dated Feb. 23, 2006 corresponding to Korean Patent Application No. 7002747/2004.

International Preliminary Exam Report dated Mar. 31, 2004 corresponding to International Patent Application No. PCT/EP02/09498.

"ShellCase Ultrathin Chip Size Package," 1999 International Symposium on Advanced Packaging Materials, Jerusalem, Israel, pp. 236-240.

Packaging of VCSEL Arrays for Cost-Effective Interconnects at <10 Meters; Hibbs et al.;1999.

* cited by examiner

PROCESS FOR MAKING CONTACT WITH AND HOUSING INTEGRATED CIRCUITS

CROSS-REFERENCE TO RELATED APPLICATIONS

This application is a Divisional application of patent application Ser. No. 10/228,699, filed Aug. 26, 2002 of the same inventors.

STATEMENT REGARDING FEDERALLY SPONSORED RESEARCH OR DEVELOPMENT

Not applicable.

This Divisional application relates to a device with contact connections which comprises at least one component integrated in a substrate material.

BACKGROUND OF THE INVENTION

Technical Field

There are known processes in which components or integrated circuits on a semiconductor chip or still joined to a semiconductor wafer are provided with a housing and electrical terminal contacts. If the mounting of the chip or of the integrated circuit and the connection of the contact regions of the chip to the contacts of the housing which lead to the outside takes place while the arrangement is still joined to the wafer, a mounting process of this type is generally known as a "wafer level package process".

A number of such processes are to be found in the prior art. These processes are generally based on it being possible for the connections to the contact regions on the chips or in the integrated circuits to be produced directly, as is the case without problems, for example, in the case of memory chips.

However, this takes no account of the fact that the optically active surface has to be left clear in the mounted state, for example on a printed circuit board, as is the case, for example, in chips with an integrated sensor or optical component.

To this extent, WO 99/40624 has disclosed a process in which it is attempted to overcome the problem outlined above by leading the terminal contacts which lie at the active component from the active side to the opposite underside of the wafer or of the chip. Further contact can then be made with the terminal contacts which have been led downward in a known way. Moreover, a similar process is described in "Wafer Level Chip Scale Packaging: Benefits for Integrated Passive Devices", Clearfield, H. M.; Young, J. L.; Wijeyesekera, S. D.; Logan, E. A.; IEEE Transactions on Advanced Packaging, Vol. 23, No. 2, pp. 247-251.

The abovementioned process is distinguished by the fact that, after a glass covering has been applied to the optically active front surface of a wafer, trenches are produced along the underside of the wafer, dividing the wafer into individual chip regions. As part of the production of the trenches, the terminal contact locations which are located on the active side of the wafer, in each case at the transition region between two chips, are split and thereby uncovered in the trenches. After the trenches have been produced, to completely house the wafer or the chips, a pane of glass is adhesively bonded over the trenches and is cut into in an appropriate way, such that the trenches in the wafer and the terminal contact locations are once again freely accessible. Then, contact tracks are deposited in the trenches which have been produced, as a result of which it is supposed to be possible to make contact with the terminal contact locations and to lay the contact location on the back surface of the housed chip.

Although the proposed process leads to through-contact being made with the terminal contacts from the active front surface of the chip or wafer to the passive back surface, a number of significant drawbacks arise in the process, so that chips which have been produced using the claimed process are disproportionately expensive. This results, inter alia, from the fact that the trenches which are to be produced in the known process are significantly wider than would normally be encountered during standard division or dicing of a wafer. As a result, this means that the distances between the chips or the integrated circuits have to be relatively great, so that there is space for fewer chips on a wafer. If only for this reason, the known process provides only a relatively low chip yield from a semiconductor wafer. Furthermore, the production process as proposed is also relatively slow. On the one hand, this is in particular because the trenches have to be ground in sequentially, and secondly this is because during production of the trenches, what is known as the dicing saw can only operate at a relatively slow advance rate. Apart from all this, the dicing saws which have to be used are very expensive. A further significant problem of the process described in WO 99/40624 is that the terminal contacts are uncovered by dividing them when the trenches are being ground open. Dividing the terminal contacts in this way requires a very high level of dimensional accuracy, since otherwise at least part of the contact may be destroyed. However, even if accurate cutting of the terminal contact is achieved, it is not easy to produce a contact connection with the terminal contacts which have been uncovered in this way. The reasons for this are in particular that in accordance with the prior art contact is to be made by depositing contact tracks on the walls of the trenches, which are inclined in the wafer, but uniform and therefore targeted deposition is only possible perpendicular to the deposition direction. Further processes for making through-contact with chips are also described in "Future Systems-on-Silicon LSI Chips", Koyanagi, M; Kurino, H; Lee, K. W.; Sakuma, K, IEEE Micro, July-August 1998, pp. 17-22, WO98/52225 and DE 197 46 641. However, these processes are unsuitable for the packaging of optical chips.

SUMMARY OF THE INVENTION

In view of this background, the present invention is based on the object of avoiding the abovementioned drawbacks of the prior art, in order in this way to provide a less expensive and simpler process for producing electrical contact connections during the packaging in particular of optical chips.

Very surprisingly, this object is achieved by a process for producing electrical contact connections for at least one component which is integrated in a substrate material, the substrate material having a first surface region, and at least one terminal contact being arranged at least partially in the first surface region for each component, wherein an optically transparent covering is applied to the first surface region, and at least one contact passage which, in the substrate material, runs transversely with respect to the first surface region is produced, in which process, in order to form at least one contact location in a second surface region which is to be provided, at least one electrical contact connection from the contact location to at least one of the terminal contacts is produced via the respective contact passages, wherein before the at least one contact passage or the at least one contact location is produced, the covering is applied, and wherein the provision of the second surface region comprises the step of thinning the substrate material, and in particular the contact passages, starting from the second surface region, substantially directly adjoining the terminal contacts.

Furthermore, the invention also is achieved by a process for mounting at least one component in a housing comprising the steps of: fabricating at least one semiconductor component in a substrate material which comprises a first surface region, which lies opposite a second surface region, at least one terminal contact being arranged at least partially in the first surface region for each integrated circuit, carrying out the process as claimed in one of the preceding claims for producing a substrate material which is provided with a first covering on the first surface region and has at least one contact location in the second surface region, applying a second covering to the second surface region. A device which can be produced in particular using one of the inventive processes, comprises an integrated circuit arrangement, comprising a chip, which includes a substrate, at least one terminal contact and, on one side, an active layer which comprises the circuits of the chip, wherein a covering of glass or transparent plastic is secured to one side of the chip, and the substrate is thinned on the opposite side, and the chip has a conductive passage which is introduced from a second side, which is opposite to the side which includes the active layer, of the first chip, and the covering having been secured before the thinning and introduction of the passage, there being an electrical contact between at least one terminal of the circuits of the chip and the conductive passage.

Advantageous refinements are to be found in particular in the respectively associated claims and subclaims.

The invention advantageously proposes a process for producing electrical contact connections for at least one component which is integrated in a substrate material, the substrate material having a first surface region, at least one terminal contact being arranged at least partially in the first surface region for each component, which is distinguished in particular by application of a covering to the first surface region and production of at least one contact passage which, in the substrate material, runs transversely with respect to the first surface region, or in a direction which is substantially perpendicular to this region, in which process, in order to form at least one contact location in a second surface region which is to be provided, above the respective contact passages, at least one electrical contact connection from the contact location to at least one of the terminal contacts is produced.

Very advantageously, it is in this way possible for a contact location to be produced on the to the terminal contact and therefore a contact location which is electrically connected to the terminal contact can be produced on that side of the substrate material which is remote from the active surface, it being possible to dispense both with trenches which run along the substrate material and with a lateral contact which leads around the component in accordance with the prior art.

According to an advantageous refinement of the process, the substrate material, in which the components are integrated, is divided into chip regions which are to be defined, on the basis of the arrangement of the components. According to the invention, the contact passages which are provided for the contact connection can be introduced into the substrate material in various ways. Firstly, there is provision for contact passages to be arranged in the substrate material, in such a manner that they are introduced into the substrate material substantially adjacent to the terminal contacts. Secondly, however, the invention provides for the contact passages to be introduced into the substrate material in such a manner that, in particular starting from the second surface region, they substantially directly adjoin the terminal contacts. The latter variant offers the advantage in particular that there is no need to relay the terminal contacts on the first surface region. In this context, relaying means that a contact track, which produces an electrical connection between the terminal contact and the contact passage, is produced on the first surface region. Introducing the contact passage next to the terminal contact may be advantageous in particular if parts of active regions of the component integrated in the substrate material are located, for example, beneath the terminal contact.

According to a further advantageous embodiment of the invention, the contact passages or at least parts thereof are introduced into the substrate material at locations where, in a subsequent process step, the substrate material is cut into different chip regions. Since, according to the invention, it is possible to use a contact passage to produce more than just one electrical contact connection, it is therefore possible, in a simple manner, to construct a contact connection to a plurality of terminal contacts on, for example, different chip regions or for different components via the individual contact passages.

According to the invention, it is extremely advantageously possible to produce the contact passages in various ways. By way of example, according to one embodiment of the invention, the contact passage is provided by doping the substrate material. In this case, it is preferable to use chemical elements from the third and fifth main groups of the periodic system, with ion implantation or thermal diffusion of the elements into the substrate material preferably being used as doping processes for production of the contact passages.

According to a further preferred embodiment of the invention, the production of the contact passages comprises in particular the provision of openings. Holes have the advantage in particular that not just one contact connection can be laid through them, but rather—depending of course on the size of the opening—a plurality of contact tracks can be laid in the opening. It is advantageous for the openings or the contact passages to be in particular electrically insulated in the lateral direction with respect to the substrate material during production, but also in general during the production of contact passages.

In the context of the invention, a very wide range of processes can advantageously be used to produce the contact passages or the openings. For example, the passages for the contacts to lead through the semiconductor material or substrate material may preferably be produced either with the aid of a dry-etching process and/or a wet-etching process.

According to the invention, the dry-etching process generally comprises photolithographic patterning of the surface which is to be processed and an anisotropic dry etch. The "ASE (Advanced Silicon Etching) Process", which is based on $SF_6$ radicals, or the "Bosch Process" is preferably used. A suitable wet-etching process is etching by means of KOH solution. The latter process in particular has cost benefits.

As has been stated, within the context of the invention it is possible for the contact passages which are to produce a through-contact engagement from one surface region to the other surface region of the substrate material or of the wafer to be arranged at various locations in the substrate material or in the chip or in the wafer. Accordingly, according to the invention it may be necessary, in order to produce the electrical contact connection or contact connections, for the terminal contacts which have been laid in the surface region to be relayed to the associated contact passages. The relaying may in this case be effected by standard photolithographic patterning and corresponding etching and the deposition of electrically conductive material. According to the invention, it is advantageously possible to use a very wide range of known deposition or coating processes. Examples of these are sputtering, CVD and/or PVD deposition and/or electroless deposition of preferably aluminum, copper or nickel.

If the contact passages according to the invention are produced, for example, by openings, these openings can also be filled, using the abovementioned processes, with electrically conductive materials, such as for example aluminum and/or copper and/or nickel and/or similar metals, in order, in this way, to produce a contact connection from the first surface region to the second surface region. At the same time, contact locations are produced in the second surface region as a result of the production of contact passages, it being possible for at least one soldering bead to be applied to the contact location in order to produce in particular external, i.e. outwardly directed contact connection. As a result, it is possible, in a simple way, for example to produce a terminal contact for a printed-circuit board.

Depending on the connection locations of said printed-circuit board or the like, it is advantageously also possible to provide for relaying of the contact location created on the second surface region.

Particularly if a plurality of conductor tracks are laid through only one contact passage, the process according to the invention offers the possibility of filling the remainder of the contact passage or of the openings which have been provided with conductor tracks with insulant, in order to insulate the contacts from one another. If the openings which have been filled in this way are subsequently divided into individual chips as part of the division of the wafer, it is in this way already possible to ensure lateral insulation of the individual chips.

In an advantageous refinement to the process according to the invention, the covering is preferably provided in the form of a glass or a comparable plastic. A glass or a plastic is recommended in particular if optically active components are to be covered. According to one embodiment of the invention, the connection between the covering and the first and/or second surface region takes place with the aid of an adhesion promoter. However, particular mechanical or optical properties can also be achieved, for example, with a covering which comprises a glass-plastic composite material or a layered material.

According to the invention, the term surface region is to be understood as meaning a substantially planar surface or a region of the substrate material which comprises the terminal contacts which are arranged on the semiconductor material of the substrate material or may project out of this material and which may lie at least in part on the inter alia one passivation layer which adjoins the substrate or semiconductor material of the substrate material.

The adhesion promoters used may advantageously be epoxy resins and/or waxes and/or sol-gels. The use of wax offers the advantage in particular that the connection created in this way can be removed again without the substrate material being destroyed. The production of a connection between the covering, which is preferably made from glass, and the substrate material on the basis of a sol-gel has proven advantageous in particular since the gel has a relatively high transparency, and furthermore forms a highly temperature-stable connection with glass in particular. Since the sol-gel is itself vitreous, i.e. can be spoken of as itself being glass, it has particularly good matching or transition properties with respect to glass in particular.

A further embodiment of the invention which is advantageous in this context consists in replacing the adhesion promoter for joining the covering to the substrate material by a process known as bonding. Anodic bonding is preferably advantageously suitable. In general, bonding requires a substantially planar surface or a planar surface region of the substrate material. Therefore, it is advantageously recommended, if the topographic differences on the substrate material or wafer are too great, for an oxide layer to be deposited on the wafer surface or the surface regions of the substrate material first of all. Examples of processes which can be used for this purpose are the "LTO (Low Temperature Oxide)" and the "TEOS (Tetraethyl Orthosilicat)" processes. Furthermore, as part of the bonding of the covering to the substrate material, the deposited oxide layer is planarized with the aid of a chemical-mechanical polishing process, in such a manner that the microplanarity and macroplanarity for the bonding are provided.

Depending on whether the contact passages are produced starting from the first surface region or from the second surface region which is to be provided, the sequence of process steps "application of a covering" and "production of at least one contact passage" varies according to the invention.

In an advantageous variant of the process according to the invention, before the contact passages are introduced into the substrate material, first of all the covering is applied to the first surface region of the substrate material, the active modules preferably being located in the first surface region. The application of the covering offers the advantage that the components located in the substrate material are protected and the arrangement acquires additional stability. The substrate material or the semiconductor wafer can then be thinned on the back surface, for example mechanically by means of a grinding process, without losing its mechanical stability, which is ensured by the covering. The through-contact making, i.e. the production of at least one contact passage in the thinned substrate material, then takes place in accordance with one of the possibilities described above on the basis of the production of doping passages or with the aid of openings provided with conductive material. It should be noted that, particularly in the procedure described above, through-contact can be made with the terminal contacts, which lie on the active upper side, starting directly from the second surface region which has been provided via the respective contact passages, therefore, as it were, from behind.

A further variant of the process for producing contact passages or contact connections according to the invention consists in the fact that blind passages can be produced in the substrate material even before the covering has been applied and the substrate material or wafer has been thinned on the back surface, these blind passages starting from the front surface or from a first surface region. The term blind passages has been selected because these passages do not generally extend as far as the second surface region. If the blind passages are formed in the form of blind openings, i.e. in the form of openings whose depth is initially less than the thickness of the substrate material, an insulator for electrically insulating the hole with respect to the substrate material is generally applied to the walls of the blind holes and laid or deposited on these contact tracks, and/or the blind holes are then filled with a conductive material. Following this, a covering is applied to the first surface region of the wafer or substrate material. On account of in particular the stabilizing action of the covering with respect to the substrate material, it is now possible, starting from the passive side of the substrate material and with the aid of a preferably mechanical grinding process, to thin the substrate material. The thinning continues at least as far as the region of the blind hole, until the conductor tracks or conductive materials which have been introduced into this hole are uncovered, so that through-contact is formed in the substrate material or wafer or chip or substrate.

A corresponding procedure is also employed if the contact passages are produced on the basis of doping passages which do not initially penetrate all the way through the substrate material.

As has already been stated in the introduction, a process for mounting at least one component in a housing also lies within the scope of the invention. In this process, first of all at least one semiconductor component is produced or provided in a substrate material, which comprises a first surface region which lies opposite to a second surface region, at least one terminal contact being at least partially arranged in the first surface region for each integrated circuit. Furthermore, a substrate material which is provided with a first covering on the first surface region and has at least one contact location is produced in the second surface region using the process proposed above, and then a second covering is applied to the second surface region. With the aid of the second covering, it is advantageously possible for the semiconductor component to be protected against damage from the outside. Furthermore, the second covering also makes it possible, if the first covering has been applied to the first surface region, for example using a wax, for this first covering to be removed again for further processing steps without the chip or wafer, which if possible has been thinned, losing stability.

In an advantageous refinement of the subject matter of the invention, openings are introduced into the second covering in particular at locations where the terminal contacts of the semiconductor component, which have been laid on the second surface region, are located. Of course, it is possible for the openings which penetrate through the covering to be introduced into the covering layer even before the actual application. In a similar manner to the openings in the substrate material, the openings in the covering may also be filled with conductive material, such as for example aluminum, copper or nickel, in order in this way to produce a connection between the terminal contacts which have been laid and the outside.

According to the invention, it is, of course, advantageously also possible by suitable measures to lay the contact locations which are situated on the second surface region in such a way that they match the position of the openings passing through the second covering. In a corresponding way, the contact locations which have been laid through the covering openings can be laid further on the uncovered side of the covering.

Furthermore, a further development of the process according to the invention, if the substrate material or the semiconductor wafer comprises a plurality of components or integrated circuits, relates to the formation of isolation trenches between the components or integrated circuits. These trenches are preferably used to electrically decouple or isolate the individual components on the various chip regions. For this purpose, the trenches which have been created may furthermore be filled with an insulant. An example of a possible insulant is epoxy resin or BCB (benzocyclobutene). During the process, the isolation trenches are arranged on the semiconductor wafer in such a manner that, by means of a substantially symmetrical distribution of the isolation trenches, the wafer is divided into various chip regions of substantially identical size. In this way, it is very advantageously possible for the components lying on the chips also to be laterally sealed or insulated with respect to the outside.

As is already apparent from the above description, both the laying of the terminal contacts and the mounting of the components in a housing can, according to the invention, take place while still part of the wafer assembly.

Furthermore, it is also within the scope of the invention to provide a process for fabricating integrated circuits which is also suitable in particular for the fabrication of integrated circuits which are of multilayer structure. The process is in particular also suitable for the fabrication of multilayer integrated circuits or for the mounting of circuits which have been fabricated in accordance with the invention on suitable bases.

In many cases, integrated semiconductor circuits which, alone or together with other circuit components or other circuits, are applied to dedicated semiconductor substrates or semiconductor wafers, are used to miniaturize electronic components. A semiconductor substrate of this type having an electronic component or preferably at least one electronic circuit constituent is to be referred to in the text which follows as a chip for the sake of simplicity. Particularly in the fields of optoelectronics and micro-opto-electromechanical systems ("MOEMS"), there are numerous possible applications for circuit arrangements of this type. For example, optical or sensor components of this type and non-optical components can be stacked on top of one another. In particular, numerous possibilities result from the combination of CMOS and CCD chips.

Furthermore, CMOS technology is generally used for logic and processor applications. However, with CMOS chips of this type it is difficult to produce optical or sensor components. By joining an optical CCD chip with a CMOS chip it is possible, for example, for a large-scale integrated memory circuit to be advantageously integrated in the imaging unit. It is also possible for the CCD chip to be combined with a processor module for data compression, so that then only compressed data have to be processed in the further electronics of the appliance.

A range of processes for mounting electronic modules on associated bases are known from the prior art, as described, for example, in U.S. Pat. No. 6,171,887. In these processes, the chip is mounted with its active side facing toward the base. In the process which is disclosed in U.S. Pat. No. 6,171,887, soldering beads are applied to the contact surfaces of the chip. This side of the chip is then covered with an insulating protective layer, the thickness of which is such that even the soldering beads are completely covered. The protective layer is ground and polished in a further step, until the contacts are partially uncovered. The chip which has been treated in this way is then joined to the base by partial melting of the electrodes and of the protective film, the electrodes making contact with associated contact surfaces of the base. This process cannot generally be used to produce stacked components, which on account of their ability to be handled independently are also referred to below as electronic modules, with optoelectronic elements, since the side which has an optical or sensor activity has been covered by the base or the element joined to the optical component.

Accordingly, the invention provides a process for fabricating integrated circuits in which a wafer which has a substrate, at least one terminal contact and, on a first side, an active layer which comprises the circuits of a chip, is used. The process comprises the following steps:

Securing a transparent covering to the first side of the wafer, thinning the wafer on an opposite side from the side which includes the active layer, introducing at least one conductive passage, which extends substantially perpendicular to the surface of the first side, from a second side of the wafer, which second side is the opposite side to the side which includes the active layer, into the wafer, and producing an electrical contact between at least one terminal of the circuits of the wafer and the conductive passage.

In this way, this process can also advantageously be further developed for the fabrication of integrated circuits which are of multilayer structure with at least two chips, each of which has at least one terminal contact and, on a first side, an active layer which comprises the circuits of the chip. For this purpose, the process provides for a covering to be secured to one side of a first one of the at least two chips. To produce a contact from one side of the chip to the other, a conductive passage, which extends in a direction which is substantially perpendicular to the surface of the chip or to the first side of the chip, is introduced into the substrate. On the other side of the chip, a contact surface is produced, which is electrically connected to the conductive passage. Likewise, at least one terminal of the circuits of the first chip is connected to the conductive passage on the first side. Then, the first chip and at least one further chip are secured onto one another in such a manner that an electrical contact is produced between the electrically conductive passage of the first chip and at least one corresponding terminal surface of the other chip.

Referring to the German patent application bearing the title "Process for making contact with and housing integrated circuits", the subject matter of this application is hereby incorporated in the present invention. This reference applies in particular to the production of a conductive passage through a wafer or a chip.

The at least one conductive passage can be produced in various ways. According to one embodiment of the process, the passage is produced by introducing a hole which is then filled with a conductive material, such as for example a metal or a conductive epoxy.

It is also possible to produce the passage by introducing a suitable doping. The doping may be carried out, for example, by ion implantation or thermal diffusion.

According to an advantageous refinement of the process, the first chip is thinned on the second side, which is the opposite side from the first side including the active layer. If the hole is produced with a depth which is initially less than the thickness of the substrate, a blind hole is formed. Likewise, under certain circumstances the penetration depth of the doping may not be sufficient to produce a conductive passage extending from one side to the other side of the substrate. According to the refinement, the thickness of the substrate, at least in the region of the hole or the doping, is made less than the depth of the hole or the penetration depth of the doping atoms by the thinning step, so that a through-contact is formed through the substrate. In this case, the holes are preferably produced by means of etching and therefore form etching pits in the substrate.

Features of further advantageous configurations of the process according to the invention are also given in the subclaims.

The process according to the invention allows a chip to be joined to a base, in particular a further chip, in such a way that the base faces the back surface of the chip and, in addition, electrical connections are produced between the top side or active side of the chip and the base. For this purpose, the chip is provided with conductive passages which extend from the top side to the underside. The passages are provided with a conductive layer or filled with a conductor, in order to produce a through-contact.

Alternatively, a surface region of the chip can be doped, so that the doping forms a conductive region which can extend as far as the opposite side and thereby forms a conductive passage. The contacts which have been led through the chip with the aid of the conductive passages can then be provided with soldering beads, by means of which the chip is joined to the base. The joining of the chips may be carried out, for example, in a similar manner to that described in U.S. Pat. No. 6,171,887. Alternatively, the contacts may, of course, also be applied to the other chip or to both.

The passages which are used to lead the contacts through the semiconductor material may inter alia be produced by means of a dry-etching process. In particular an anisotropic dry-etching process, such as for example the "ASE process" based on $SF_6$ radicals, is suitable for this purpose. In this context, an inexpensive alternative is anisotropic etching using KOH solution, which is recommended for Si wafers with a (100) orientation. Of course, combinations of the abovementioned processes can also be used to produce the passages. Furthermore, these processes can also be employed to produce isolation trenches, in which case the isolation trenches can, for example, be etched in one step together with the passages. However, it is also possible, inter alia, in each case to use a different one of the abovementioned processes or a different combination of these processes to etch the isolation trenches and to etch passages.

The module which is to be connected to the optical or sensor chip for its part requires through-contacts for connection to the circuit board or to a further chip. Therefore, this chip is prepared in a similar way to the optical or sensor chip above, the module having two sets of contact surfaces. In terms of orientation and position, one set of contact surfaces fits together with the corresponding through-contacts of the optical chip, while the second set is used to produce through-contacts to the circuit board or the next module down.

During the process steps according to the invention, the modules are preferably still joined to the wafer, i.e. have not yet been separated from the wafer during production.

According to a preferred embodiment of the invention, the wafer is adhesively bonded on the optical side to a transparent covering, for example a thin pane of glass. In this way, the modules on the wafer are protected and the arrangement acquires additional stability. The adhesive used may be a suitable epoxy resin. The wafer can then be mechanically thinned on the back surface by a grinding process, the mechanical stability continuing to be ensured by the transparent covering. The through-contacts can in this case be produced in two different ways. In a first variant of the process, the top side of the optical chip is photolithographically patterned and the etching pits are introduced. In this variant, the conductive passages are located next to the contact surfaces or bonding pads for connection of the chip. The etching pits are then filled with a conductor and a conductor track is applied from the etching pit to the bonding pad. The transparent covering can then be applied, and after this the wafer is thinned on the back surface until the conductive fillings of the etching pits emerge on the back surface.

According to another alternative, the covering is applied in advance and the wafer is thinned. The photolithographic patterning and the etching in this case take place from the underside of the chip, the etching pits being located beneath the bonding pads situated on the top side and being etching until the bonding pads are uncovered.

The non-optical chips are prepared in a similar way; in this case too, the process may be carried out while the chips still form part of the wafer assembly. The non-optical chips, to which the optical chips are applied, initially, as mentioned above, have two sets of contact surfaces or bonding pads which are used for through-contact or for connection of the optical chip or a chip above it. The wafer with the non-optical chips is likewise thinned, but without endangering the stability. The thinned wafer is then photolithographically patterned and etched through at the locations at which through-contact is to be made. As in the case of the optical chips, these process steps of patterning and etching can be carried out both from the top side or active side and from the underside. The passages through the wafer which are formed by the etching pits are then metallized or filled with a conductor. If the passages are located next to the associated contact surfaces, the contact surfaces are connected to the filled passages by conductor tracks. The contact surfaces are provided with soldering beads on both sides. If appropriate, it is also possible to dispense with the step of applying these contacts which are intended for connection of the optical chip or chips above it, provided that fusible contacts of this type are already located on the associated contacts of the chip above.

The chips which have been prepared in this way can then be connected to one another. If the chips are arranged in the same way on the wafers, so that the corresponding contacts come to lie above one another when the wafers are placed on top of one another, the chips can be connected while they are still joined to the wafer. Otherwise, the wafer with the smaller chips is sawn up by means of a dicing saw and the chips are then placed onto the other wafer. Then, the two wafers or the chips are joined to the wafer by melting or reflow of the solder of the soldering beads, so as to produce contacts between the chips. To join the wafers or chips to one another, it is preferable to use a high-melting solder which has a higher melting point than the solder used to connect the circuit board. This prevents the connections between the chips of the chip stack from being broken again during connection to the circuit board. By way of example, pure tin can be used to connect the chips to one another. In a final step, the chips are cut up using a dicing saw.

During the preparation of the chips on the wafers, after application of the transparent covering they can be packed using various wafer-level packaging processes.

The process according to the invention also allows more than two layers of components or chips to be joined, in which case the correspondingly prepared parts are joined to one another either simultaneously or in succession.

If the elements of the multilayer integrated semiconductor arrangement are successively secured to one another in accordance with one exemplary embodiment, the mechanical stability which is additionally imparted to the wafer or chip which was in each case attached last on account of the assembly of the elements allows it to be thinned further in relative terms. This exemplary embodiment is therefore based on the wafers or chips being successively secured to one another, then being thinned. The consequence of this is that the holes or etching pits in the chips have to be etched through in relative terms a thinner substrate, and therefore their diameter remains smaller.

Furthermore, it should be noted that the top chip of the stack produced using the process does not have to be an optical chip. Rather, the invention can be used to join any desired semiconductor modules to one another to form compact three-dimensional stacks. By way of example, the process is particularly suitable for stacking memory modules which can be joined to one another without an insulating interlayer between the chips. It is also possible for integrated circuits on different substrates, such as Ge, Si and GaAs, to be advantageously combined with one another in a space-saving manner. It is also possible for a very wide range of sensor chips to be combined with further modules using the process. The sensor chips may, for example, include radiation, pressure, temperature or moisture sensors. It is also possible to use chemically sensitive sensors which respond to certain gases or liquid constituents.

A transparent covering may also advantageously be patterned. In this way, by way of example, optical elements, such as prisms, gratings or optical filters, can be integrated in the covering.

If transparent coverings are not supposed to be or do not have to be present on the top chip, for example if the top chip is not an optical chip, the chip can also be secured to a base by means of a detachable wax, which imparts additional strength during the production process, in particular during the thinning. Alternatively, the covering may also be fixed, for example, by means of an epoxy resin during the production process, and this epoxy resin can be detached again under the action of UV light.

According to the processes of the invention, the invention also covers a multilayer integrated circuit arrangement which comprises at least two chips arranged above one another, which in each case have a substrate, at least one terminal contact and, on one side, an active layer which comprises the circuits of the chip. At least one of the chips of the circuit arrangement advantageously has a conductive passage, there being electrical contact between at least one terminal of the circuits of the chip which has the passage and the conductive passage, on the one hand, and a terminal surface of the further chip having the conductive material, on the other hand.

The fully assembled multilayer integrated semiconductor arrangement may additionally be provided with a protective housing. A multilayer integrated circuit arrangement of this type, which has been produced using the process according to the invention and has been provided with an advantageous protective housing during production, forms a housed multi-package comprising at least two chips which are arranged above one another and, one side, each have at least one terminal contact and an active layer which comprises the circuits of the chip and are at least partially surrounded by a housing, wherein a covering is secured to one side of a first one of the chips, the substrate of the chip is thinned on the opposite side from the side which includes the active layer, and the chip has a conductive passage which is introduced from this side of the first chip, which is the opposite side to the side which includes the active layer, and the covering having been secured before the thinning and the introduction of the passage, there being an electrical contact between at least one terminal of the circuits of the chip, which includes the passage and the conductive passage, on the one hand, and the terminal surface of a further chip having the conductive passage, on the other hand.

According to the inventive processes, the invention also covers a device which preferably includes a component which has a sensor or optical or corresponding external activity, the component being protected or insulated with respect to the outside by means of two coverings on its first and second surfaces and a lateral insulation.

BRIEF DESCRIPTION OF THE DRAWINGS

The present invention is described in detail below with reference to individual exemplary embodiments. In this context, reference is made to the appended drawings; in the individual drawings, identical reference numerals denote identical components, and in the drawings.

DETAILED DESCRIPTION OF THE INVENTION

In connection with the following detailed description of preferred embodiments, reference is made first of all to an exemplary embodiment which is illustrated in FIGS. 1 to 5. FIGS. 1 to 5 show the process steps of a first variant of the process according to the invention for producing electrical contact connections on the basis of various cross-sectional views of a semiconductor wafer 10 or semiconductor chip 10. In this case, the latter is supposed preferably to be a sensor chip, and in this instance, by way of example, an optical or pressure-sensitive or moisture-sensitive chip, etc., in which it is particularly important that the active sensor side can or should be uncovered after contact has been made or after securing or contact connection of the chip on, for example, a board or to other equipment or devices. The process steps illustrated in FIGS. 1 to 5 use cross-sectional views also to show process steps which are suitable for preparing a chip for joining to form a three-dimensional chip stack.

Figure 1:
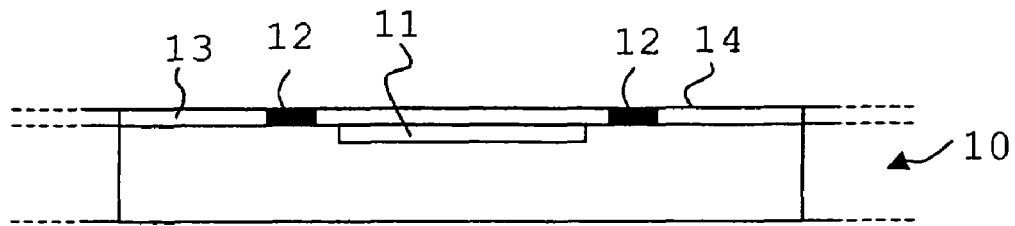
FIGS. 1 to 5 show the sequence of a first variant of the process according to the invention for production of electrical contact connections on the basis of various cross-sectional views through a semiconductor chip or semiconductor wafer.

The optical chip or sensor chip shown in FIG. 1 is arranged in the wafer assembly 10 and, in accordance with the semiconductor wafer 10, comprises a substrate 1, on the top side 14 of which there is an optically active layer 11, such as for example the sensor layer of a CCD chip. The top side 14 of the chip is additionally covered with a passivation layer 13. Moreover, on the surface there are contact-making surfaces or bonding pads 12 which are used for connection of the chip and are connected to the optically sensitive layer 11 via conductor tracks.

Figure 2:
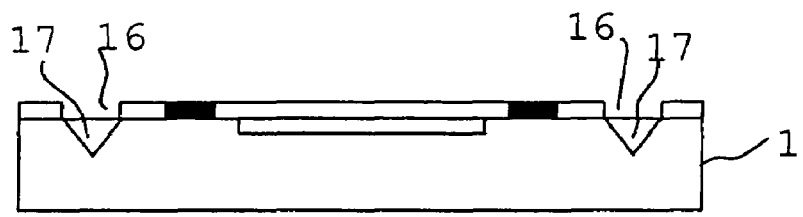

After the wafer has been prepared, first of all, in a subsequent step of the process, as shown with reference to FIG. 2, openings 16 are made or introduced into the passivation layer at the locations at which it is intended for through-contacts to be provided, and the substrate is uncovered at these locations. This step may be carried out, for example, by photolithographic patterning followed by ion beam etching.

In a subsequent etching procedure, etching pits or blind openings 17 are etched into the substrate, the passivation layer 13 protecting the substrate from being etched outside the openings 16. For further processing, a depth in the range from approx. 50 to 200 μm is sufficient for the blind openings, given an overall substrate thickness of approx. 500 μm. One suitable reprocess for producing the etching pits is anisotropic etching of an Si(100) substrate using KOH, during which process etching pits with an aperture angle of approximately 70° are formed, the diameter or cross section of the pits on the active surface being dependent on the etching depth and/or the aperture angle.

Figure 3:
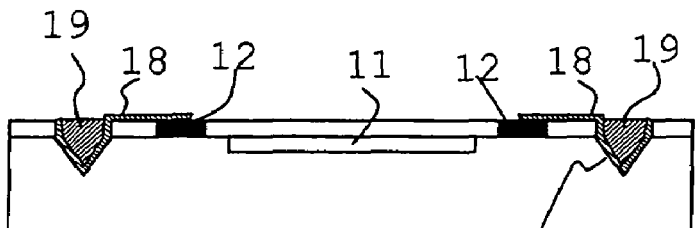

Then, contact is made between the etching pits and the bonding pads. FIG. 3 shows a cross-sectional view of the chip after these production steps. To produce the contacts, the etching pits 17 and regions of the top side 14 between the etching pits are coated with a metal. As a result, a metal layer 18 is formed, which layer is situated on the walls of the etching pits and on regions in conductor form between the etching pits, the layer at least partially covering the bonding pads in order to produce a reliable contact. A suitable contact-making metal is, for example, aluminum, copper or nickel. Next, the metal-coated etching pits are filled with a metal, so that the pits are filled with a solid conducting structure 19.

Then, contact is made between the etching pits and the bonding pads. FIG. 3 shows a cross-sectional view of the chip after these production steps. To produce the contacts, the etching pits 17 and regions of the top side 14 between the etching pits are coated with a metal. As a result, a metal layer 18 is formed, which layer is situated on the walls of the etching pits and on regions in conductor form between the etching pits, the layer at least partially covering the bonding pads in order to produce a reliable contact. A suitable contact-making metal is, for example, aluminum, copper or nickel. Next, the metal-coated etching pits are filled with a metal, so that the pits are filled with a solid conducting structure 19.

As an alternative to what is illustrated in FIG. 3, however, it is also possible for the pit to be filled with a conductive material first and then for a conductor track to be laid from the contact surface 25 to the filling 19 in order to produce an electrical contact.

Figure 4:
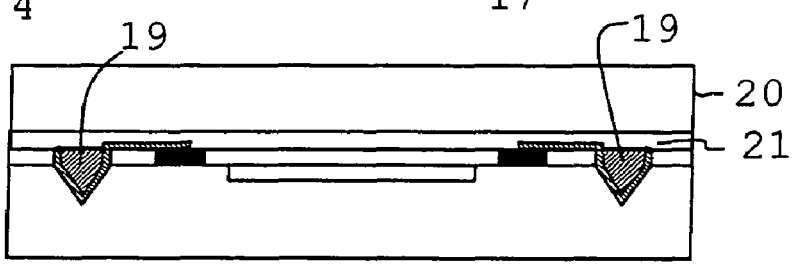

As the next step, the top side 14 of the chip 1 is provided with an optically transparent covering 20 in order to protect the optically sensitive layer 11. The result of this production phase is shown in FIG. 4. In addition to the protection of the semiconductor circuits on the chip top side 14, the covering also has the function of mechanically stabilizing the overall structure, which is important for the subsequent process steps, in particular for the thinning of the wafer, starting from the passive side, which is yet to be described. The covering 20 is preferably adhesively bonded to the chip by means of an epoxy resin layer 21. An example of a suitable covering is a pane of glass or similarly transparent plastic.

Figure 5:
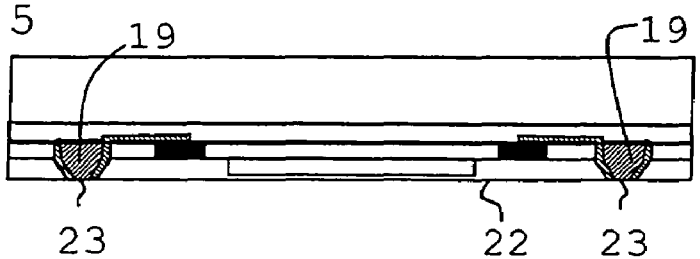

To produce a contact through the chip, the underside or inactive side 22 of the chip is ground down until the conductive fillings 19 of the etching pits 17 are reached and, as a result, contact locations or contact surfaces 23 are formed on the underside 22 of the chip. In this case, the contact location may, according to one of numerous possible embodiments, have a width, for example, of approx. 50 μm. The assumption in this case is that the wafer has a total thickness of, for example, approx. 500 μm and the blind opening has a penetration depth of slightly more than 200 μm, so that after the substrate has been thinned, the tip of the blind hole is uncovered up to a width of 50 μm. This production state is shown in FIG. 5.

In this context, it should be noted that it is advantageous if the wafer is thinned until it is as thin as possible, in particular even thinner than in the above example, since as a result in particular the cross section of the opening and the hole depth can be kept very small, the stability of the wafer being ensured by the covering or the glass 20.

The wafer is now in a form which is such that the bonding pads lie on the passive side of the wafer. It can then be processed further in the same way as a non-sensor chip, e.g. using all known wafer level packaging (WLP) processes.

Therefore, this process allows the range of WLPs for non-sensor chips to be widened considerably. The chips which have been provided in this way with laid contact locations (23) can then, in the housed or open state, be made contact with by conventional SMT (Surface Mounted Technology) on a board or on a printed-circuit board.

Figure 6:
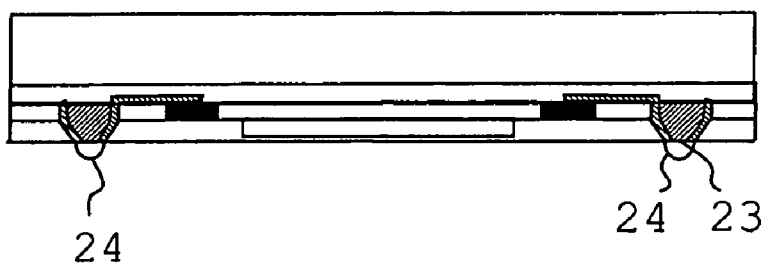
FIGS. 6 to 8 show an illustration corresponding to FIG. 1 of possible further process steps involved in the inventive processes shown in FIG. 1.
Figure 7:
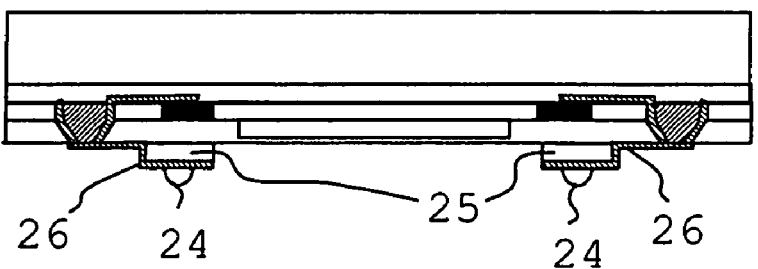
Figure 8:
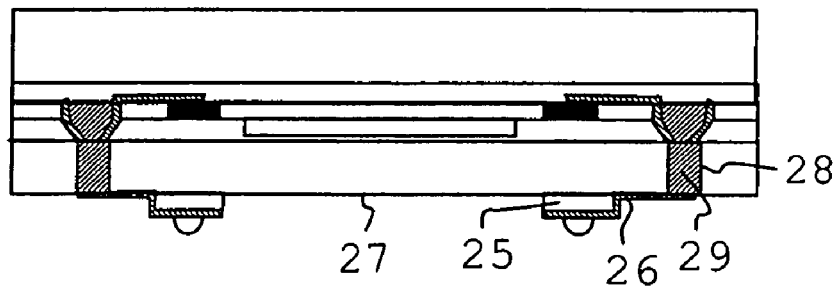

To this extent, FIGS. 6 to 8 show further possible process steps which may follow the process step shown in FIG. 5. FIGS. 6 to 8 also show, in particular, on the basis of cross-sectional views through a chip, various embodiments of the chip shown in FIG. 5 after further possible processing steps which are suitable as preparation prior to the joining of chips produced according to the invention to form a chip stack.

For possible joining of the chips to a further module below them, it is expedient, for example, to apply soldering beads which are joined to the contact surfaces. In the most simple form, which is shown in FIG. 1, the soldering beads 24 are applied direct to the contact surfaces 22. If appropriate, the terminal locations on the underside of the chip can also be redistributed. This may be necessary, for example, if the further module, onto which the chip is to be stacked or to which the chip is to be connected, has the contact surfaces at locations which do not match the contact surfaces of the chip. One possible way of arranging redistributed contacts on the passive side of the chip is shown in FIG. 7. In this embodiment, first of all bonding pads 25 are arranged on the back surface of the chip at the desired positions. Then, conductor tracks are applied from the bonding pads 25 to the contact surfaces 23, which have been formed as a result of the grinding and/or etching of the back surface at the fillings 19, and soldering beads 24 are applied to the bonding pads 25.

To move one step closer to the housing of the chip or mounting of the chip in a housing while still joined to the wafer, a further covering 27 is applied to the underside 22 of the chip. A chip of this type, which is "sandwiched" between two coverings 20 and 27, is shown in FIG. 8. Since the coefficient of thermal expansion of the covering glass 20 and, for example, of semiconductor material of the chip or substrate 1 may differ, a bimetal effect may occur when the chip is heated or cooled, with the result that the chip bends slightly. In this case, the underside material 27 (BCB, plastic, glass, etc.) has to be mechanically matched to the upper material, as far as possible in such a way that the rigidity of the materials, comprising thickness, modulus of elasticity and coefficient of thermal expansion, compensate for one another. Therefore, it is by no means necessary for the upper material 20 to be identical to the lower material 27.

If the substrates of the chips which are to be fitted together have different coefficients of thermal expansion or are at different temperatures in operation, it is also recommended to use an interlayer between the chips, which interlayer, on account of its flexibility, can reduce the temperature stresses which are produced between the substrates. The embodiment shown in FIG. 8 may also be provided with a flexible interlayer of this type for the stacking of chips. In this embodiment of the process, first of all the underside or passive side 22 of the chip is provided with an interlayer 27.

By way of example, in the case of the flexible covering shown in FIG. 8, after the process step shown in FIG. 5 has been completed, first of all the interlayer 27 can be adhesively bonded to the underside or passive side 22 of the chip, the layer 25 having passages 28, the arrangement of which in the covering matches the contact surfaces 23. The passages may be filled with a conductor 29 in a similar manner to the etching pits 17. A suitable process consists, for example, in electrodeposition of Cu or Ni. Alternatively, it is also possible for a conductive epoxy to be pressed into the etching pits. Working from this point, the contacts made using soldering beads 24 can then be produced in the same way as in the previous exemplary embodiment.

In accordance with the exemplary embodiment described below, the top side 14 of the chip 1 which has been prepared as shown in FIG. 1 is firstly adhesively bonded to a transparent covering 20 by means of an adhesive layer 21.

FIGS. 9 to 12 likewise use cross-sectional views of a chip region of a semiconductor wafer to illustrate the process steps involved in a further embodiment of the process according to the invention. The process steps of this further exemplary embodiment of the invention which are shown in FIGS. 9 to 12 are likewise suitable for preparation for the joining of a chip to form a multilayer integrated circuit arrangement.

Figure 9:
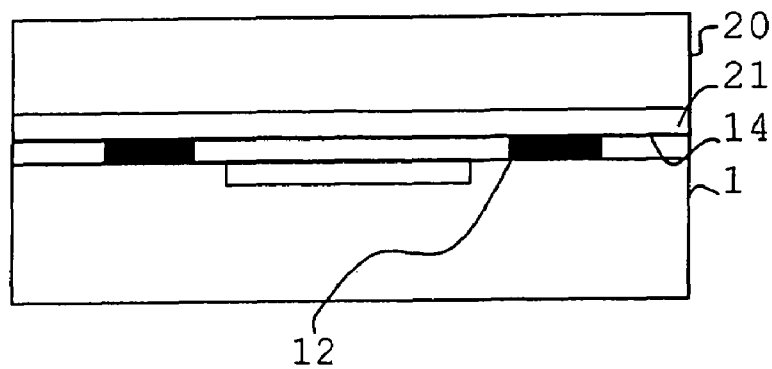
FIGS. 9 to 12 show the process steps in accordance with a further embodiment of the process according to the invention.
Figure 10:
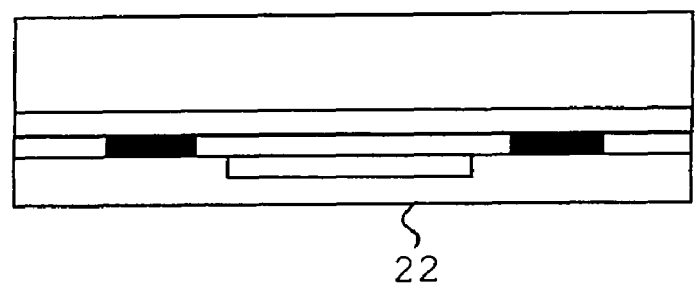

Accordingly, the top side 14 of the chip 1 which has been prepared as shown in FIG. 1 is initially adhesively bonded to a thin transparent covering 20 by means of a layer of adhesive 21. This intermediate stage of the process is shown in FIG. 9. The chip or wafer which has been prepared in this way can then be thinned without danger on its underside 22, as shown with reference to FIG. 10, since the structure has acquired sufficient stability on account of the joining to the covering.

As has already been mentioned, after the etching and/or grinding, the thickness of the wafer should be as low as possible.

Figure 11:
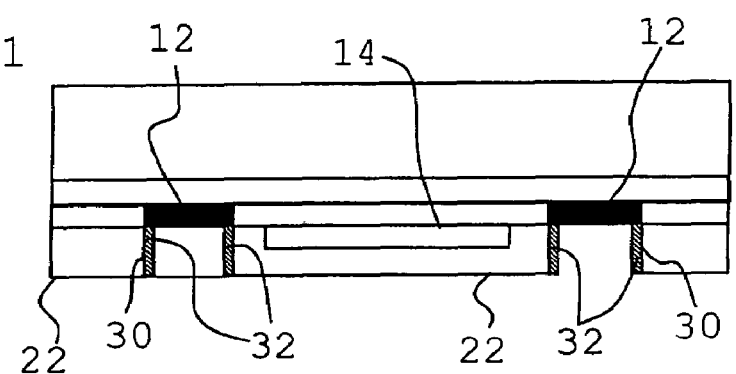

Then, as shown in FIG. 11, etching pits 30 are introduced into the chip; unlike in the preceding exemplary embodiment, however, etching is now carried out from the underside 22 until the etching pits make contact with the bonding pads 12 situated on the top side 14 of the chip. The metal layer of the bonding pads 12 in this case acts as an etching stop. The etching process or the depth etching preferably takes place in conjunction with photolithographic patterning and an anisotropic dry-etching process, for example what is known as the "ASE process" using $SF_6$. The holes produced in this way generally taper inward or widen outward. Furthermore, a blind hole produced in this way is rounded at the end of the blind hole, or in this case at the bonding pads.

The edges or walls of the etching pits or openings 30 are then insulated with respect to the substrate 1 by means of conformal plasma oxide deposition. The insulating layer is denoted by 32. An insulation 32 of this type is in principle optional. However, in many cases it is required if the substrate is highly doped, in order to avoid short circuits. To this extent, suitable processes are the LTO (Low Temperature Oxide) process based on $SiH_4$ or a process based on TEOS oxide (TEOS, tetraethyl orthosilicate). The plasma oxide deposition is generally followed by an etch-back step, in order, inter alia, to uncover the back surface of the bonding pads 12 again. Then, as can be seen from FIG. 12, the etching pits or openings 30 are filled with a conductive material. The fillings 31 can in turn be effected by electrodeposition of metal in the etching pit or by filling the openings with a conductive adhesive (conductive epoxy) by means of the screen-printing/doctoring technique.

Figure 12:
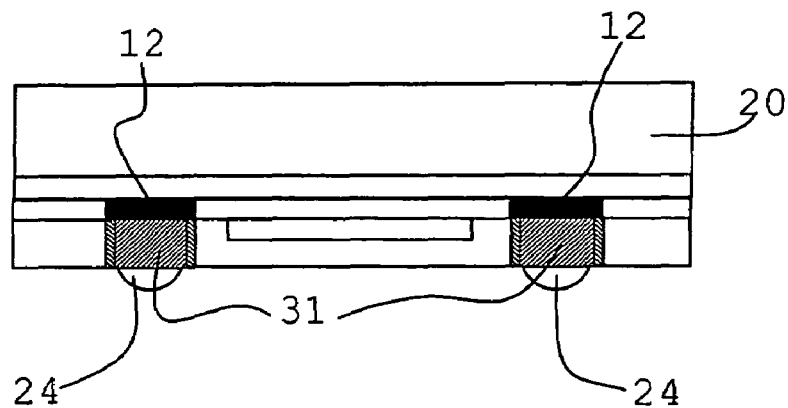
Figure 13:
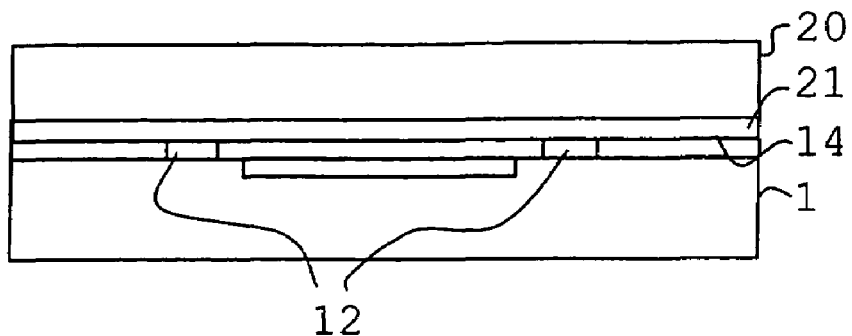
FIGS. 13 to 16 show a variant of the process illustrated with reference to FIGS. 9 to 12 with a redistribution of the terminals.
Figure 14:
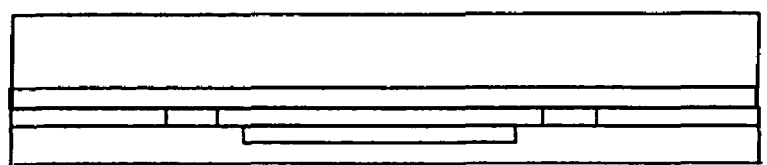
Figure 15:
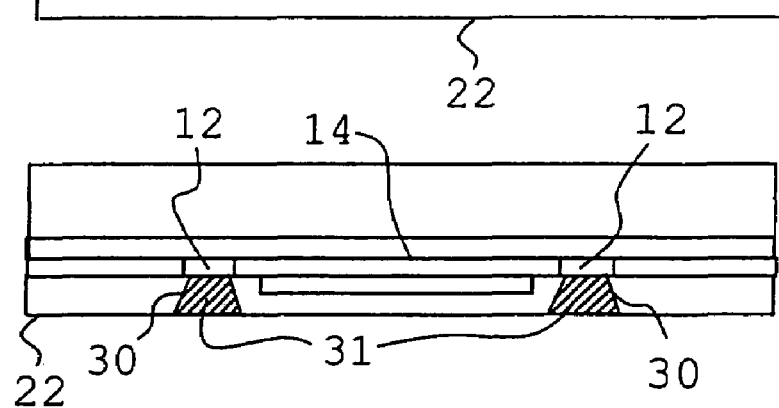
Figure 16:
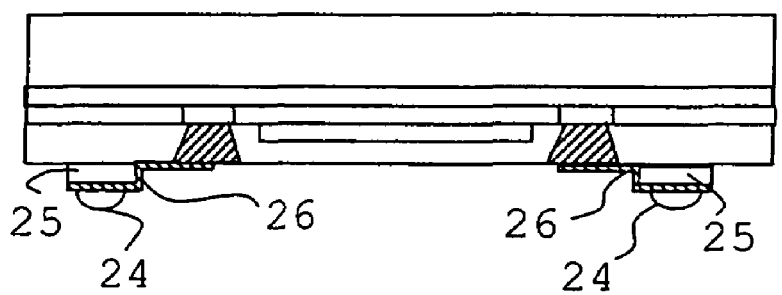

With the fillings 31 produced in the substrate in this way, the procedure can then continue in a similar manner to that described in the previous exemplary embodiment. Therefore, the soldering beads 24 may, as shown in FIG. 6, be applied direct to the fillings 31 and shifted by redistribution in a similar manner to that shown in FIG. 7. Furthermore, in accordance with FIG. 8, it is possible for a further covering to be applied to the back surface 22 and for external contact to be made with the contact locations, which are created via the fillings 31, through the covering. FIGS. 13 to 16 show such a variant of the process illustrated with reference to FIGS. 9 to 12, with redistribution of the connections in a similar manner to the embodiment shown in FIG. 8, the bonding pads 25 to which the soldering beads 24 are applied being arranged laterally offset with respect to the through-contacts and being connected to the through-contacts via applied conductor tracks 26. As shown in FIGS. 11 and 12, the application of the insulating layer 32 has been omitted for the sake of clarity. On account of the anisotropic etching, the etching pits 30 have a shape which tapers conically toward the first surface 14.

As an alternative to filled etching pits, the regions 31 in the figures may also represent conductive doped regions which likewise form a through-contact through the substrate.

Figure 17:
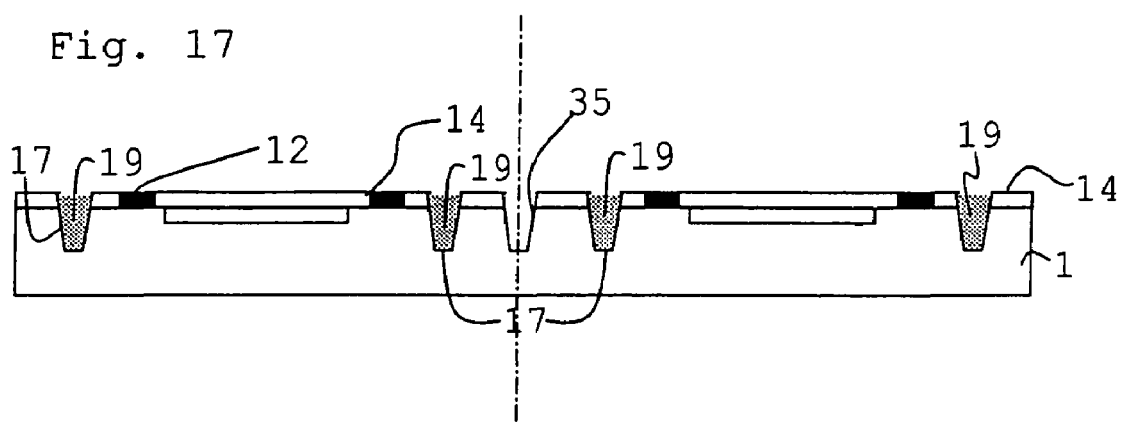
FIGS. 17 to 19 show a cross-sectional view, corresponding to the above illustrations, of a further variant of the contact connection process according to the invention.
Figure 18:
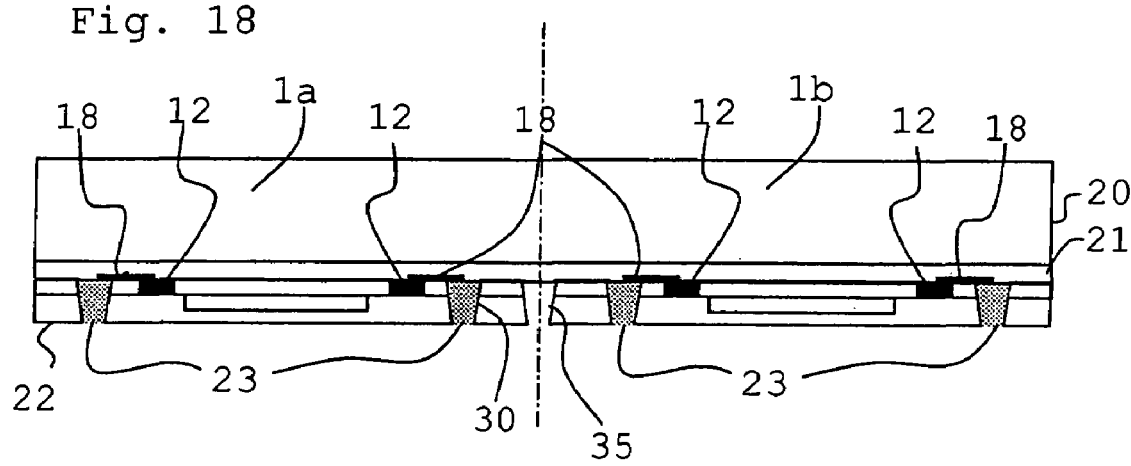
Figure 19:
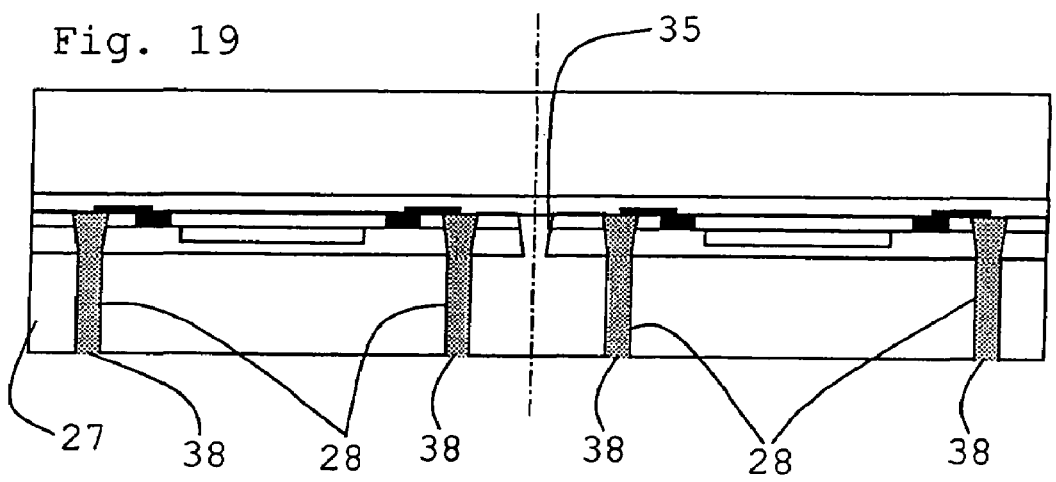
Figure 20:
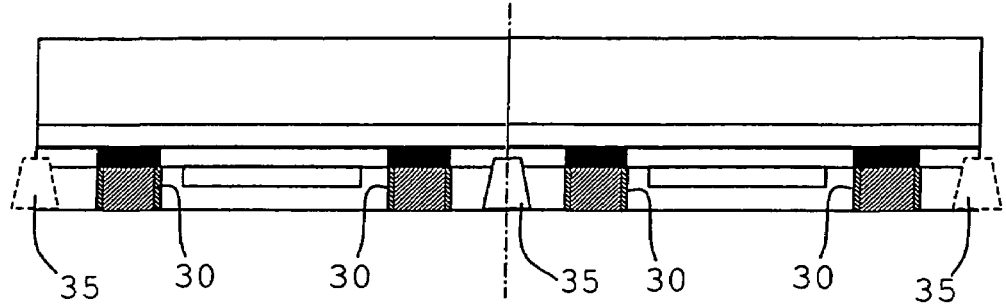
FIGS. 20 to 21 show a further exemplary embodiment of the invention, in which isolation trenches have been introduced between the chip regions on the wafer from the passive side.
Figure 21:
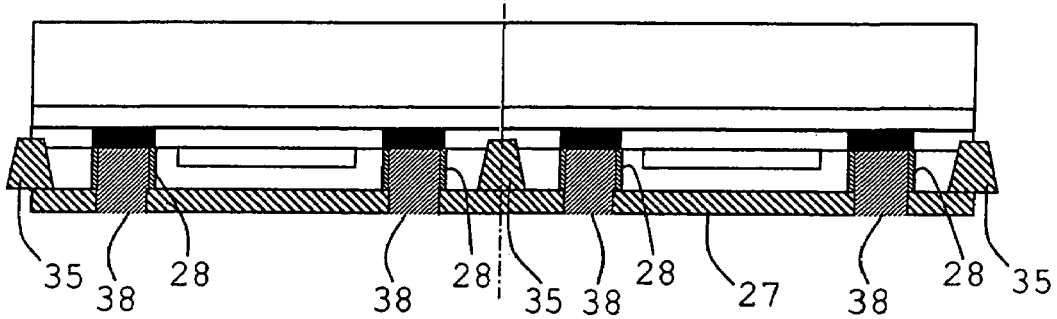

FIGS. 17 to 19 show possible further process steps with a view to complete housing of the chips 1a and 1b in the wafer assembly 1. For this purpose, on the one hand the process steps which have already been explained above for making through-contact and producing the contact surfaces 23 are carried out. Furthermore, however, trenches are additionally produced along the separating lines between chips which are adjacent on the wafer, by means of suitable etching processes. This production of trenches between the chips results in the possibility of lateral sealing of the chips with, for example, epoxy resin, so that there is no longer any bare silicon. The active front surface and the passive back surface of the wafer 1 or of the chips 1a and 1b are coated with coverings as before. The front surface is preferably coated with a glass 20 and the back surface is preferably also coated with a glass or is coated with a layer 27 which can be photopatterned (e.g. BCB or benzocyclobutene), the latter also flowing into the trenches 35. In this context, reference is also made, by way of example, to FIGS. 20 and 21. According to this embodiment, the trenches 35 were introduced into the substrate 1 from the back surface of the wafer 1, in a pattern corresponding to the openings, by grinding or etching (FIG. 20). If, as discussed and as illustrated in FIG. 21, a BCB layer is then applied to the back surface, the trenches 35 are also filled with BCB in insulating form and a lateral seal is produced. The dicing, i.e. the separation of the wafer into individual chips, subsequently takes place at the trenches 35.

Figure 22:
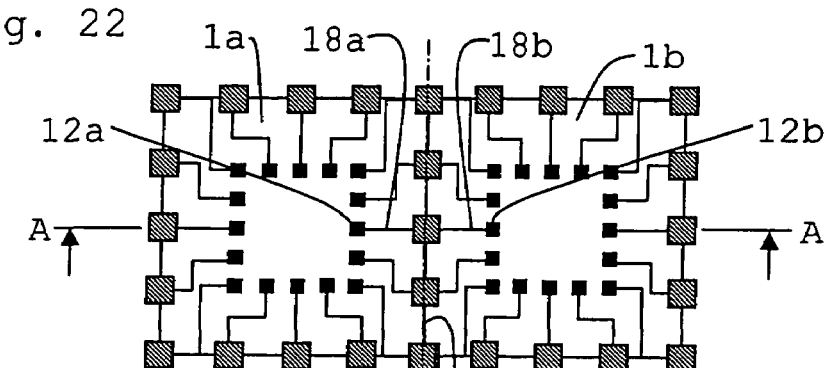
FIGS. 22 to 23 show an embodiment according to the invention in which through-contact locations for at least two bonding pads have been produced along the separating lines between the chips on the wafer.
Figure 23:
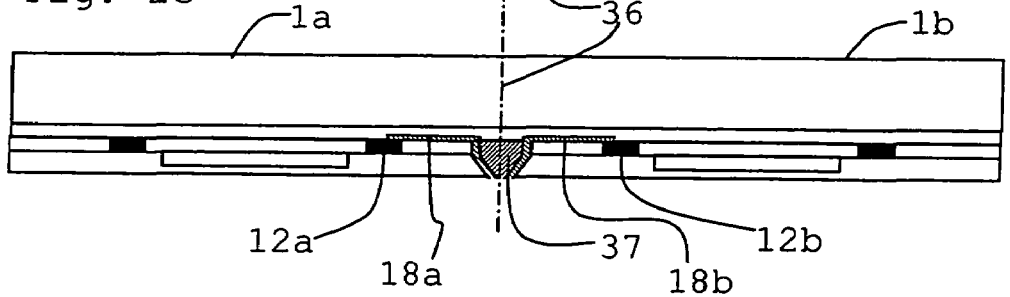

Likewise, in the same way as for the production of the etching pits for the conductive passages, the trenches 35 can also be produced using an anisotropic dry-etching process, for example by means of an ASE process or by anisotropic etching with KOH solution. In general, the etching of the etching pits and of the isolation trenches 35 can also be carried out by a combination of various etching processes. For example, an etching pit or an isolation trench may, for example, be produced in a first step by means of wet-etching and then further by means of anisotropic dry-etching. In general terms, it is possible to use both the same etching process and different etching processes or combinations of the etching processes to produce trenches and etching pits. For example, one possible embodiment provides for wet-chemical pre-etching of the isolation trenches, followed by the joint etching of surface regions for isolation trenches and conductive passages by means of anisotropic dry-etching. Therefore, the combination of various etching processes allows the shape, for example the steepness of the walls, and also the size and depth of the etched structures to be advantageously controlled. FIGS. 22 and 23 show a further possible embodiment of a through-contact according to the invention. In this respect, FIG. 23 shows the cross section in direction A. The through-contact passages 17 and 19 in this case lie along the chip separation lines 36 on the wafer. In this way, it is easily possible, via an etching pit 17, to make contact with two or more bonding pads 12a and 12b of adjacent chips 1a and 1b by suitable redistribution of the contact locations with respect to the through-contact location 19. For this purpose, after electrical insulation of the walls of the blind opening, contact tracks 18 were laid into this opening. However, unlike in the process shown in FIGS. 1 to 5, the blind opening is not additionally filled with a conductive material, but rather is filled with an insulant 37. This has the positive effect that, after the wafer has been separated along the separation line and/or along the through-contact locations, the individual chips are laterally insulated with respect to the outside.

The modules below are prepared in a similar manner to the preparation of the upper chip described above. Possible embodiments are shown in the cross-sectional views presented in FIGS. 24 to 26. The chips located in the chip stack below the top module require two sets or types of bonding pads, of which one set is used to produce the contact with the chip above it and the other set is provided for the purpose of producing the connection to the chip below or, if the chip is the bottommost chip in the stack, of producing the connection to the circuit board or a base which is provided.

Figure 24:
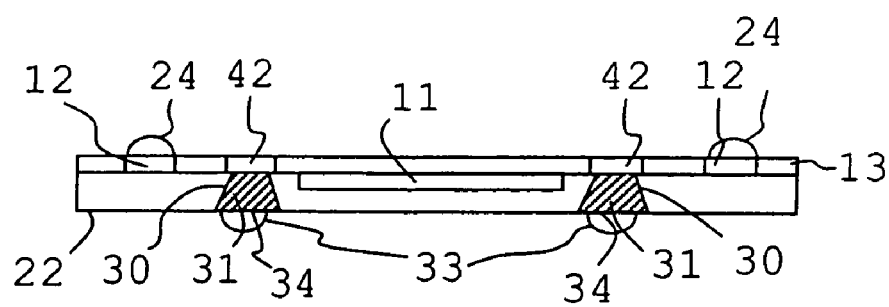
FIGS. 24 to 26 show cross-sectional views of various embodiments of chips for a chip stack which, in the three-dimensional, multilayer electronic module, are located beneath the top chip.

For this purpose, the chip is thinned on the passive side as much as is allowed by the stability constraints during the production process. If the chips are still joined to the wafer, an unsupported wafer can be thinned to approximately 200 μm to 300 μm. FIG. 24 shows a first possible embodiment of a chip 2 of this type, which may, for example, be a memory module. The chip 2, like the chip 1 described above, has an active layer 11 which lies beneath a passivation layer 13 and in which the components of the integrated circuit are located. Soldering beads 24 are applied to a first set of bonding pads 12 and are subsequently used for connection to the chip above, for example the top chip 1.

In accordance with the embodiment shown in FIG. 24, etching pits 30 are etched into the underside 22 and extend as far as the bonding pads 42 of the second set of contact surfaces. The passages formed in this way are likewise, as in the top chip 1, filled with a conductor 31. To make contact with the next level of the chip stack, soldering beads 33 are once again melted onto the contact surfaces which are formed on the underside 22 of the chip as a result of the filling.

If there is to be no further level of the chip stack, i.e. the chip 2 is the bottom chip in the stack, the solder used for the soldering beads 33 may advantageously have a lower melting point than the material used for the other soldering beads 24. As a result, the assembled chip stack can be secured to a circuit board or some other base by melting the soldering beads 33 without the other soldering beads 24 melting.

Figure 25:
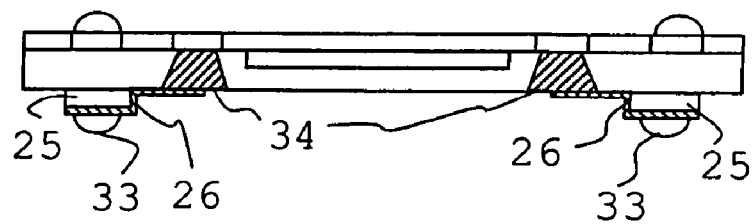

FIG. 25 shows another embodiment, in which the terminal contacts comprising bonding pads 25 with soldering beads 33 have been redistributed and, by means of conductor tracks 26, have been connected to the contact surfaces 34 of the filling 31.

Figure 26:
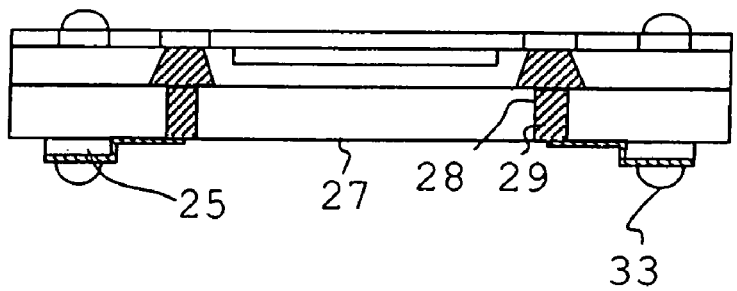

FIG. 26 shows a further embodiment of the chip 2, in which, in a similar manner to that shown in FIG. 8, a lower covering 27 has been applied and can function as a protective packaging and/or a flexible interlayer, in order to absorb thermal stresses between the chips. As in the previous example and as in FIG. 8, the chip is illustrated with redistributed contacts, comprising bonding pads 25 with soldering beads 33.

In this case too, the passages 28 are filled with a conductive filling 29 in order to make contact through the passages 28 located in the covering 27 all the way down to the underside of the covering. In this arrangement, it may be expedient for the redistribution of the contacts to be carried out in such a way that the lateral positions of the contacts lying on the underside and top side of the chips match one another. In this way, it is possible for a plurality of chips 2 to be combined with one another in any desired way with regard to the order and number in a chip stack. This may be advantageous, for example, if a chip stack of this type comprises a plurality of memory modules. Furthermore, in this way a plurality of different variants which differ only with regard to the number of stacked memory modules can be produced from the same individual modules without unnecessarily high outlay.

Figure 27:
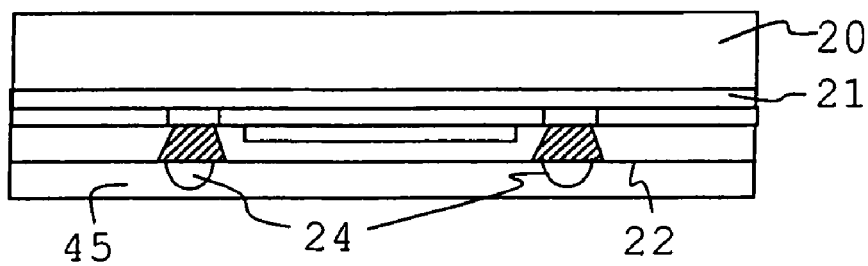
FIGS. 27 to 29 show, on the basis of cross-sectional views, the steps of an exemplary embodiment, and in particular the way in which the top chip can be assembled with a chip below it to form a chip stack.
Figure 28:
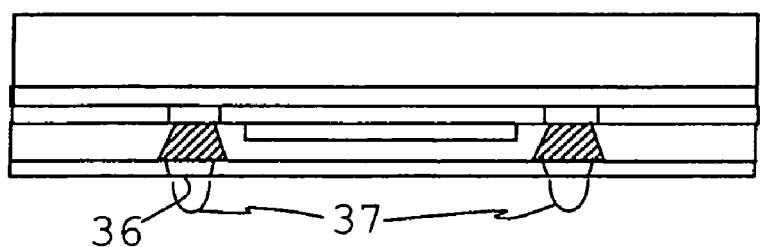
Figure 29:
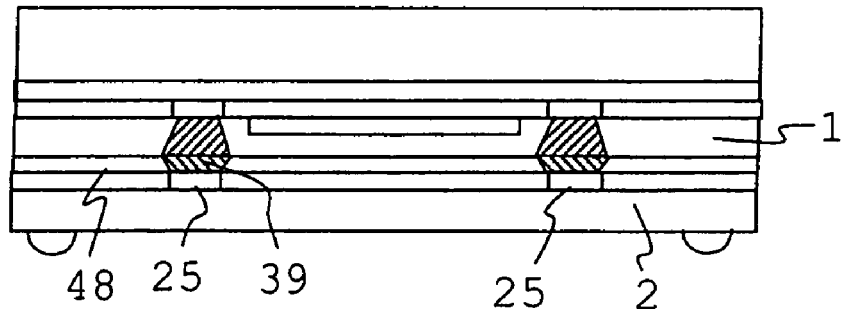

FIGS. 27 to 29 show, on the basis of cross sections, the steps of an exemplary embodiment allowing the top chip to be joined to a chip below it to form a stack.

Starting from an optical chip as illustrated, for example, in FIG. 12, which has been joined to a covering 20 by means of a layer of adhesive 21 and has soldering beads 24 at the contacts which have been made on the underside, the module is covered with a layer of adhesive 45 on its underside 22, as shown in FIG. 27. A thermoplastic can be used for this layer. The layer thickness is selected in such a way that the soldering beads 24 are completely covered.

Then, the layer 45 is ground down until the soldering beads 24 project and are ground flat together with the layer, so that, as illustrated in FIG. 28, planar contact surfaces 36 are formed. Soldering beads 37 are in turn placed onto these surfaces.

FIG. 29 shows the optical chip 1 which is connected to a further chip 2. For connection, the solder of the soldering beads is melted onto the bonding pads 25 of the two chips by heating, and the soldering beads on the contact surfaces of the two chips 1, 2 combine to form a soldered joint 39. As a result of the heating, the thermoplastic layer 48 also softens and adhesively bonds the two modules.

Moreover, when the chips are placed onto one another, a self-aligning effect results from the surface tension of the molten solder. On account of the surface tension, the chips are drawn in one direction, such that the lateral spacing of the contact surfaces 25, which have been connected to one another by means of the solder, between the chips is minimized.

A further exemplary embodiment of the process according to the invention is explained below with reference to the diagrammatic cross sections shown in FIGS. 30 to 34. This exemplary embodiment is based on successive securing with subsequent thinning of the wafers or chips, the assembly which has already been put together imparting additional stability to the module or wafer attached last, so that the latter can be thinned further.

Figure 30:
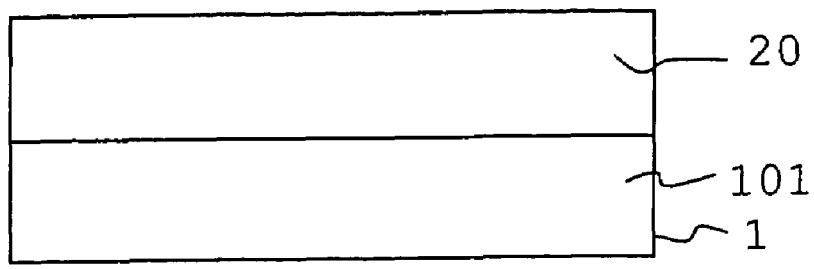
FIGS. 30 to 34 show, on the basis of diagrammatic cross-sectional views, a further exemplary embodiment of the process according to the invention.
Figure 31:
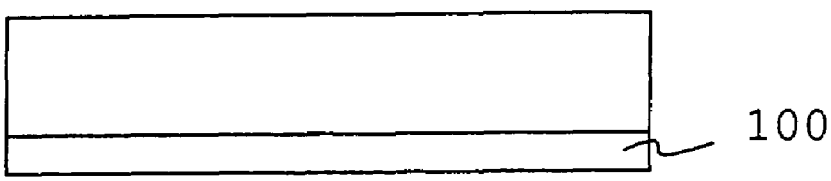
Figure 32:
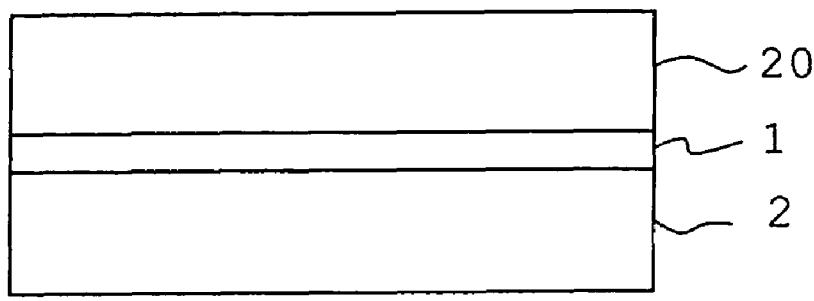

In accordance with FIG. 30, first of all a covering 20 is once again secured to the first or top chip 1. The substrate 100 of the chip 1 is then thinned (FIG. 21) and through-contacts are produced in accordance with the process which has been described with reference to FIGS. 9 to 12 (these steps are not shown here). Then the next chip 2 is fitted and secured as a result of the through-contacts on the first chip 1 being connected to associated terminals on the further chip 2. At this time, the chip 2 which has been fitted on does not yet have any etching pits, holes or doped regions for the through-contact. However, since the wafer or chip which has been fitted on is now fixedly connected to the first chip, the chip 2 which has been fitted on, on account of the assembly with the first chip 1 and the covering 20, has a mechanically stable base and can be thinned to the same extent as the first chip 1 of the stack without danger.

Figure 33:
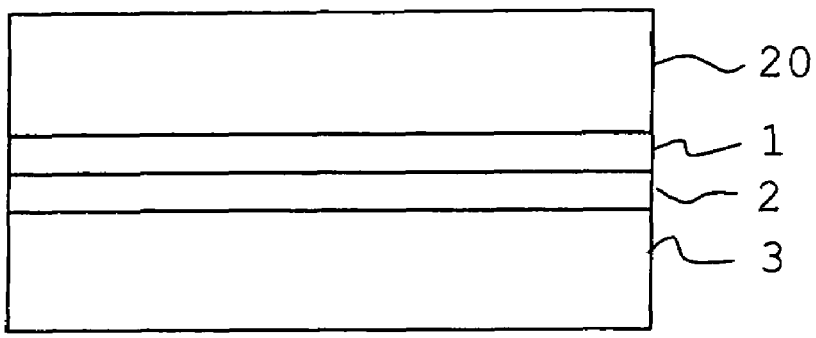

Then, in a further step, through-contacts are produced in the chip 2 which has been fitted on, as described with reference to FIGS. 9 to 12, 13 to 16 or FIGS. 24 to 26, and a further chip 3 or wafer can be fitted on. This production state is illustrated in FIG. 33.

Figure 34:
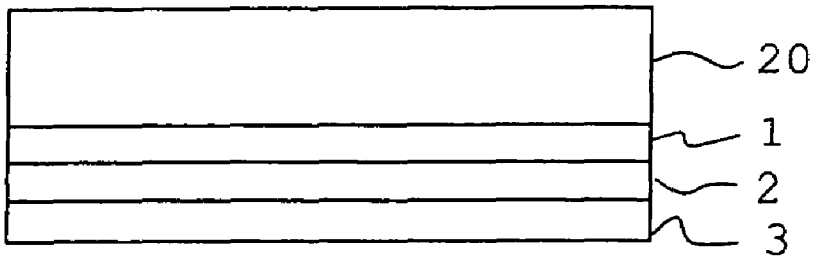

These steps can be repeated with any desired number of components individually or joined to the wafer, resulting in the formation of a chip stack as diagrammatically depicted in FIG. 34 with three chips 1, 2 and 3 fitted onto one another. The chips may be connected to one another either directly or via insulating and/or flexible interlayers.

All the steps which have been described hitherto can be carried out while the chips still form part of the wafer. Therefore, it is additionally possible to integrate various wafer level packaging processes, at least partially or in individual steps, in the process according to the invention.

Furthermore, the bonding or bonding-together or connection of the chips to form a stack can also be carried out while they are still joined to the wafer. A precondition for this to take place is for the chips to be arranged in the same way in the lateral direction on various wafers, so that the chips of a stack come to lie on top of one another when the wafers are placed onto one another.

The chips joined to the wafer which have been stacked on top of one another can then be separated using a dicing saw.

Figure 35:
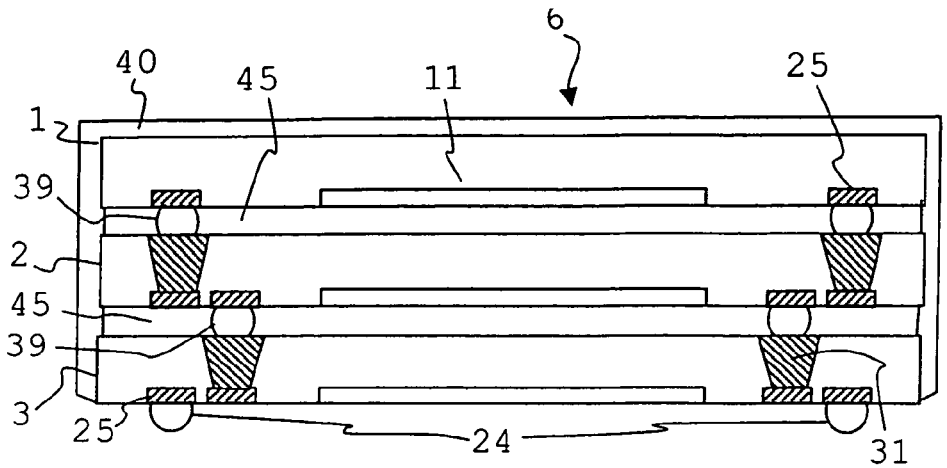
FIGS. 35 to 37 show cross-sectional views of embodiments of fully assembled multilayer electronic modules.
Figure 36:
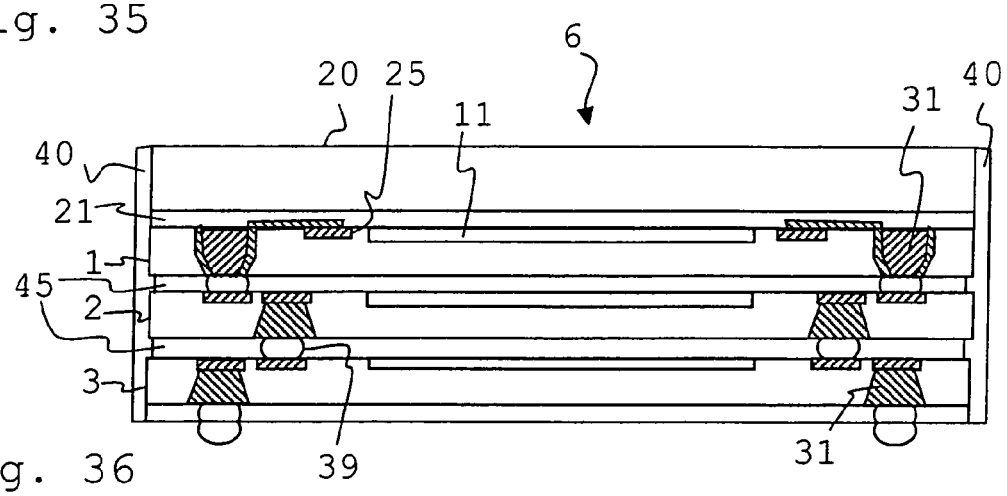
Figure 37:
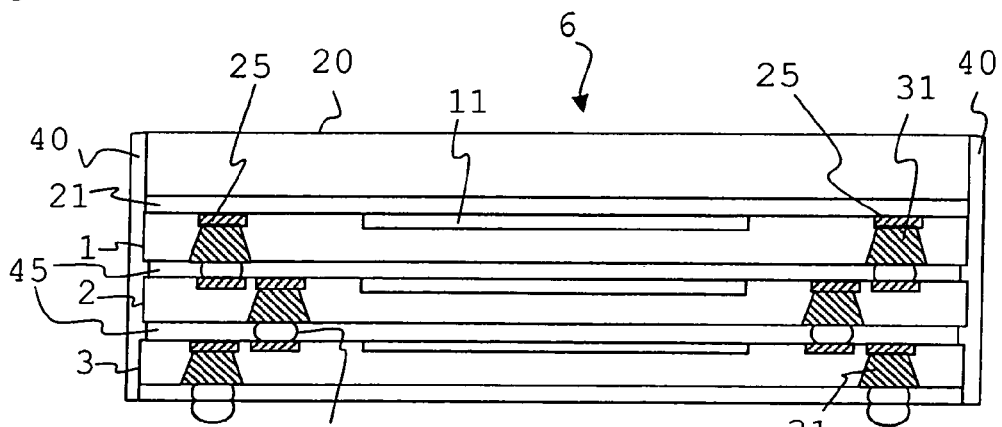

FIGS. 35 to 37 show embodiments of chip stacks 6, produced as described above, with three layers. Specifically, FIG. 35 shows an embodiment of a chip stack 6 in which the top chip 1 is not an optical module, but rather comprises a different integrated circuit, the side bearing the active layer 11 facing the module 2 below it. Accordingly, in this embodiment through-contacting of the top chip is not required.

By contrast, the chips 2 and 3 below it have through-contacts which have been produced using the process according to the invention. The conductive fillings 31 of the through-contacts of the chips 2 and 3 are connected to corresponding bonding pads 25 of the chip 1 or 2 which respectively lies above them via soldered joints 39. Between the chips there are interlayers 45 which connect the chips to one another and can serve as flexible compensation layers in order to reduce thermal stresses produced between the chips.

On the other hand, in this embodiment the underside of the bottom chip 3 of the chip stack 6 is not sealed. Consequently, the chip stack 6 can be used further as in what is known as flip-chip technology and can be connected to contact surfaces of the substrate provided, for example to a circuit board, by melting the soldering beads 24. After the chip stack which has been assembled while still joined to the wafer has been separated from the stack of wafers, the multilayer integrated module or chip stack 6 formed in this way can be sealed with an epoxy resin cladding 40.

FIG. 36 shows a possible embodiment of a chip stack 6 with an optical chip as the top element.

In this case, the optical chip 1 is prepared in accordance with the process steps shown in FIGS. 1 to 5, in which the etching through the substrate takes place from the top side, i.e. the active side, and then a transparent covering 20 is applied to the wafer via an optical epoxy resin layer 21. The chip is then bonded together with the lower chips 2 and 3. The bonding may be carried out as described with reference to FIGS. 27 to 29.

In this exemplary embodiment, the underside of the chip stack is also provided with a covering, which serves as a flexible interlayer or compensation layer between the bottom chip of the stack and the base, on the one hand, and/or as a protective packaging, on the other hand.

FIG. 37 shows a variant of the chip stack illustrated in FIG. 36. The variant shown in FIG. 37 represents a particularly preferred embodiment. This embodiment differs from the embodiment shown in FIG. 36 in that in this case the conductive passages 31 have been introduced not from the side which has the active layer 11, but rather, for all the chips of the chip stack which have been provided with through-contacts, from the opposite side. In this case, the insulating layers 32 shown in FIGS. 11 and 12 have been omitted for the sake of clarity.

The multilayer integrated circuit arrangements which are described with reference to FIGS. 35 to 37 and are additionally at least partially provided with a protective covering or are surrounded with a housing represent housed multipackages. The housing comprises all parts of the multipackage which cover the chips, such as for example the transparent covering 20, the epoxy resin cladding 40 or a lower adhesive layer 45.

Figure 38:
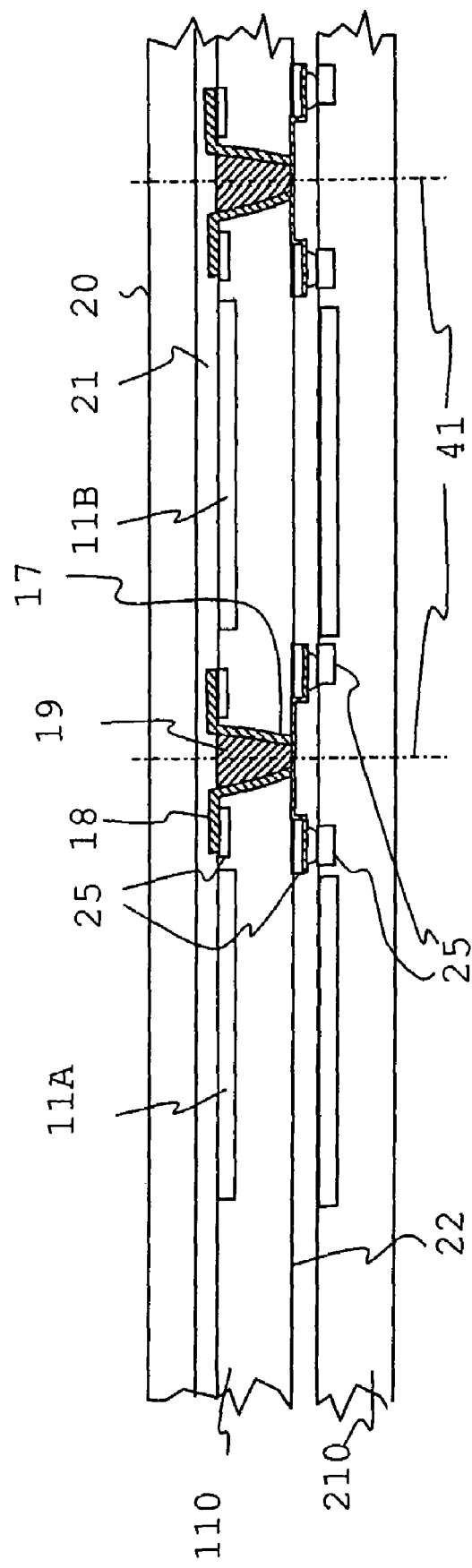
FIG. 38 shows a cross-sectional view of a further embodiment.

FIG. 38 shows a cross section through an exemplary embodiment in which a plurality of chips which are held together as part of a wafer split a through-contact. The chips for the top position in the stack, which have been produced on a wafer 110 while still part of the wafer, are prepared in accordance with the process explained with reference to FIGS. 1 to 5. Here, however, a metal layer 18 which connects contact surfaces 25A, 25B to the etching pit 17 is applied, the contact surfaces 25A and 25B being connected to the active layers 11A, 11b of two different modules which are still joined to the wafer.

The contacts are redistributed on the underside 22, as shown in FIG. 7 or 8. During connection of the wafers 110, 120, the redistributed contacts are connected to the contact surfaces 25 of the modules of the wafer lying below in each case. The wafers can be separated from the wafer assembly after connection has taken place, along separation lines 41 which run centrally through the joint through-contact. After the chip stack has been separated, the result is not a through-contact, but rather a contact which runs around the edge of the substrate of a chip in the chip stack.

After completion, a chip stack produced using one of the exemplary embodiments described above can be processed further using a known process. For example, the chip stack or the multilayer semiconductor arrangement can be joined directly to a circuit board using SMD technology processes or may be cast into a suitable housing for SMD processes or through-hole techniques.

The invention claimed is:

1. A device comprising:
    a semiconductor substrate having a thickness substantially less than that of an unprocessed wafer, the semiconductor substrate having a top side and a bottom side;
    at least one optically active element formed in the top side;
    at least one topside contact formed on the top side and connected to the optically active element, the at least one topside contact having a bottom surface facing the semiconductor substrate;
    at least one via formed in the semiconductor substrate communicating between the bottom surface of the at least one topside contact and the bottom side of the semiconductor substrate, the at least one via having a rounded shape at the bottom surface; and
    a layer of metal formed on side walls of the at least one via connecting the bottom surface of the at least one topside contact to the bottom side of the semiconductor substrate.

2. The device as claimed in claim 1, wherein the at least one via has substantially tapered side walls such that a distance between the side walls at the top side is substantially less than a distance between side walls at the bottom side.

3. The device as claimed in claim 1, further comprising a bottom side contact and means for connecting the bottom side contact to the layer of metal.

4. The device as claimed in claim 1, wherein the at least one optically active element is an integrated circuit.

5. The device as claimed in claim 1, wherein the side walls comprise an insulation layer.

6. The device as claimed in claims 1, 2, 3, 4 or 5, further comprising a transparent cover fixed to the top side.

* * * * *